United States Patent [19]

Hoke et al.

[11] Patent Number: 5,448,084
[45] Date of Patent: Sep. 5, 1995

[54] FIELD EFFECT TRANSISTORS ON SPINEL SUBSTRATES

[75] Inventors: William E. Hoke, Wayland; H. Jerrold Van Hook, Lexington, both of Mass.

[73] Assignee: Raytheon Company, Lexington, Mass.

[21] Appl. No.: 705,479

[22] Filed: May 24, 1991

[51] Int. Cl.⁶ .................................... H01L 29/161
[52] U.S. Cl. .................... 257/190; 257/194; 257/615
[58] Field of Search ............... 357/22 A, 22 I, 22 K, 357/60; 257/190, 192, 194, 200, 289, 615

[56] References Cited

U.S. PATENT DOCUMENTS

| | | | |
|---|---|---|---|
| 3,802,967 | 4/1974 | Ladany et al. | 357/4 |
| 3,862,859 | 1/1975 | Ettenberg | 357/30 E |
| 3,868,523 | 2/1975 | Klopfer | 357/30 E |
| 4,482,906 | 11/1984 | Hovel et al. | 357/16 |
| 4,761,620 | 8/1988 | Bar-Joseph et al. | 357/22 K |
| 4,777,517 | 10/1988 | Onodera et al. | 357/60 |
| 4,827,320 | 5/1989 | Morkoc et al. | 357/22 A |
| 4,928,154 | 5/1990 | Umeno et al. | 357/60 |
| 4,980,750 | 12/1990 | Ueno | 357/60 |
| 5,023,675 | 6/1991 | Ishikawa | 357/22 A |
| 5,043,777 | 8/1991 | Sriram | 357/22 A |
| 5,060,030 | 10/1991 | Hoke | 357/22 A |

OTHER PUBLICATIONS

Duffy, M. T., et al., Epitaxial Growth and Piezoelectric Properties of AlN, GaN, and GaAs on Sapphire or Spinel, Journal of Electronic Materials, vol. 2, No. 2, 1973, pp. 359–372.

Maruyama, Susumu, GaAs Layers Deposited on (001) MgAl₂O₄ by Molecular Beam Method, Jpn. J. Appl. Phys. vol. 24 (1985), No. 3, pp. 363–364.

Ryshkewitch, Eugene, Oxide Ceramics, Physical Chemistry and Technology, 1960, Academic Press, New York and London, pp. 256–275.

Simon, R. W., et al., Of High-Temperature Superconductor Thin Films, Commercial Crystal Laboratories, Inc., Naples, Florida, 7 pages.

Wang, C. C., Epitaxial Growth and Properties of GaAs on Magnesium Aluminate Spinel, vol. 121, No. 4, pp. 571–582.

*Primary Examiner*—Sara W. Crane
*Assistant Examiner*—Courtney A. Bowers
*Attorney, Agent, or Firm*—Donald F. Mofford; William R. Clark

[57] ABSTRACT

A field effect transistor including a substrate comprised of a material having a spinel crystal structure and a buffer layer lattice matched to the crystal structure of the substrate comprising gallium aluminum indium arsenide is described. Several types of field effect transistors are possible with the described substrate arrangement, including metal semiconductor field effect transistors, insulating gate field effect transistors, pseudomorphically strained and pseudomorphically strain compensated metal semiconductor field effect transistors, as well as, high electron mobility transistor structures.

14 Claims, 2 Drawing Sheets

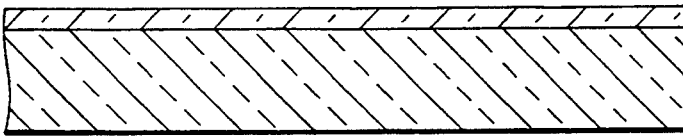
Fig. 1
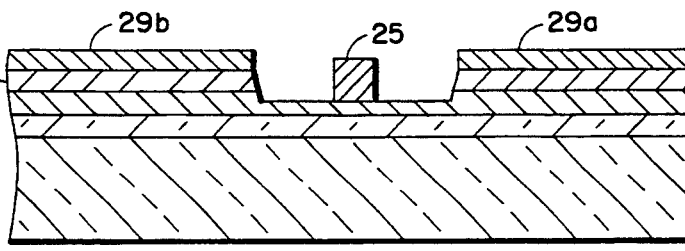
Fig. 2
Fig. 2A
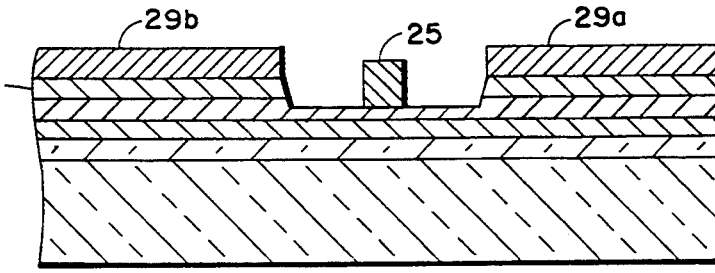
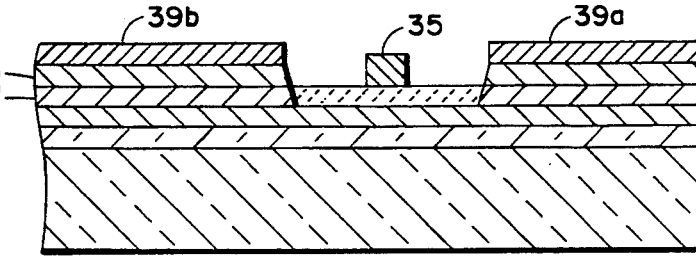
Fig. 3

FIELD EFFECT TRANSISTORS ON SPINEL SUBSTRATES

BACKGROUND OF THE INVENTION

This invention relates generally to field effect transistors and, more particularly to field effect transistors which operate at microwave frequencies.

As is known in the art, there are several types of field effect transistors (FETs) generally used at microwave and millimeter wave frequencies. These transistors include metal semiconductor field effect transistors (MESFETs) and high electron mobility transistors (HEMTs) each fabricated from Group III–V materials. What distinguishes a HEMT from a MESFET is that in a HEMT charge is transferred from a doped charge donor layer to an undoped channel layer, whereas in the MESFET the channel layer is doped and thus provides its own carriers. Generally, in HEMTs the charge donor layer is a wide bandgap material such as aluminum gallium arsenide, whereas the channel layer is of a lower bandgap material.

There are in addition two general types of high electron mobility transistors. One type is referred to simply as a HEMT, whereas the other type is a pseudomorphic HEMT. The difference between the HEMT and the pseudomorphic HEMT (PHEMT) is that in the pseudomorphic HEMT one or more of the layers, generally the channel layer, has a lattice constant which differs significantly from the lattice constant of the other materials providing the other layers in the device. Thus due to a resulting lattice constant mismatch, the crystal structure of the material of the channel layer is elastically strained.

As mentioned above, in a HEMT the doped charge donor layer is comprised of a wide bandgap material such as gallium aluminum arsenide, whereas the channel layer is typically comprised of a lower bandgap material such as gallium arsenide.

In the pseudomorphic HEMT, the undoped gallium arsenide channel layer is replaced by a channel layer comprised of a lower bandgap material such as gallium indium arsenide. Indium arsenide had a lattice constant which is substantially different than the lattice constant of either gallium arsenide or aluminum arsenide. An indium gallium arsenide channel layer provides a layer of a material having a lattice constant which is substantially larger than the lattice constant of gallium arsenide or gallium aluminum arsenide. This lattice constant mismatch makes practical growth of PHEMTs difficult and otherwise limits several advantages which would have accrued to a device using gallium indium arsenide as a channel layer. For example, the use of gallium indium arsenide as a channel layer would provide a device having several performance advantages over a simple gallium arsenide channel layer. One advantage relates to the lower bandgap characteristic of gallium indium arsenide which provides a larger conduction band discontinuity at the gallium aluminum arsenide/gallium indium arsenide heterojunction, compared to that of a gallium aluminum arsenide/gallium arsenide heterojunction. Accordingly, the charge density transferred into the GaInAs channel layer is higher because of the larger discontinuity. Moreover, gallium indium arsenide also has a higher electron mobility and higher saturated electron velocity than gallium arsenide. Each of these benefits thus can provide a pseudomorphic HEMT which theoretically can handle higher power levels, as well as, operate at higher frequencies with improved noise properties when compared to a high electron mobility transistor using a conventional gallium arsenide channel layer. These benefits also should increase with increasing indium concentration in the gallium indium arsenide layer.

Accordingly, a major objective in fabricating a high performance pseudomorphic HEMT structure is to maximize the amount of indium contained in the gallium indium arsenide layer. A problem arises, however, in increasing the indium concentration. As mentioned above, gallium indium arsenide has a lattice constant which is larger than the lattice constant of gallium arsenide or gallium aluminum arsenide with the latter two having substantially equal lattice constants. This disparity in lattice constants increases with increasing indium concentration. Thus, when gallium indium arsenide is disposed over gallium arsenide, the film develops intrinsic strains. For in-plane atoms, the strains are compressive whereas for atoms perpendicular to the growth plane the strains are tensile. This arrangement is commonly referred to as tetrahedral distortion.

For a gallium indium arsenide layer which is thicker than the so-called "critical thickness" for the particular composition of the gallium indium arsenide layer this intrinsic strain causes the gallium indium arsenide film to be disrupted with formation of various types of crystal dislocations or defects. The presence of such crystal dislocations or defects seriously degrades the electron transport properties of gallium indium arsenide layer. For a gallium indium arsenide layer having a thickness less than the so-called critical thickness of the layer, the material is elastically strained without such dislocations forming. In the growth plane, the gallium indium arsenide takes on the lattice constant of the underlying gallium arsenide or gallium aluminum arsenide layer, whereas the crystal of the gallium indium arsenide is deformed such that in a plane perpendicular to the growth plane the crystal has expanded. This type of layer is termed pseudomorphic from which is developed the term pseudomorphic HEMT. With increasing indium concentration, the critical thickness at which the gallium indium arsenide layer forms crystal defects decreases. For example, for a channel layer comprised of gallium indium arsenide having the concentration $Ga_{0.8}In_{0.2}As$ a layer thickness of approximately 100 Å is the maximum thickness. Layers thinner than 100 Å are not attractive due to the increased importance of the quantum size effect which reduces the effective bandgap discontinuity and thicknesses much above 100 Å can result in the above-mentioned lattice dislocation problem.

One approach to addressing the problems resulting from the lattice mismatch between gallium indium arsenide and aluminum gallium arsenide is to grow gallium indium arsenide alloys or layers on indium phosphide substrates. The lattice matched composition of gallium indium arsenide on indium phosphide substrates is $Ga_{0.47}In_{0.53}As$. For some applications, this is an acceptable arrangement. However, other applications require additional material improvement. There are problems experienced with the gallium indium arsenide indium phosphide system. One problem is that in a high electron mobility structure incorporating gallium indium arsenide as a channel layer, an aluminum indium arsenide charge donor layer having a composition of $Al_{0.48}In_{0.52}As$, which lattice matches to the indium phosphide, is also used as the layer over which the Schottky barrier electrode is placed for field effect and high electron mobility transistor types. The bandgap of such a material is 1.5 eV compared to 1.8 eV for gallium aluminum arsenide ($Ga_{0.75}Al_{0.25}As$) which is used as a Schottky barrier contact material for conventional HEMTs grown on gallium arsenide substrates. The lower bandgap of the aluminum indium arsenide layer in addition to the small bandgap of gallium indium arsenide reduces the breakdown voltage and consequently limits the power performance for devices based on indium phosphide substrates. Moreover, in the indium phosphide system, aluminum indium arsenide is used as the buffer layer as well as a charge donor layer in the Schottky barrier layer. However, high material quality of aluminum indium arsenide is difficult to achieve. This is because aluminum arsenide is best grown at high temperatures, whereas indium arsenide is best grown at low temperatures. The resulting compromise in growth temperatures leads to a compromise in material quality. Another problem is that indium phosphide substrates are considerably less thermally stable than gallium arsenide which is a further limitation on useable growth temperatures. Indium phosphide substrates are also more fragile than gallium arsenide leading to difficulties in handling and fabricating devices over the indium phosphide substrates. Further, indium phosphide substrates are doped with iron to provide substrates having semi-insulating properties. Iron is known as a fast diffuser in gallium arsenide. Thus, there exist a danger that iron may migrate from the indium phosphide substrates into the active layers of the transistor. Iron present in the active layers of the field effect transistors would seriously degrade their performance characteristics, since iron forms deep carrier traps.

SUMMARY OF THE INVENTION

In accordance with the present invention, a semiconductor device includes a substrate comprised of a material having a spinel crystal structure and a buffer layer lattice matched to the crystal structure of the substrate, said buffer layer comprising (gallium, aluminum) indium arsenide having a indium concentration selected in accordance with the lattice constant of the spinel crystal to lattice match the buffer layer to the substrate. For semiconductor devices such as field effect transistors, a channel layer is disposed over the buffer layer and the channel layer is comprised of a layer of gallium indium arsenide. Means are provided over the channel layer for providing ohmic collection from said channel layer and means are provided over said channel layer for providing a Schottky barrier contact over said channel layer. With such an arrangement by providing a substrate comprised of spinel and a buffer layer and an active layer comprised of (gallium, aluminum) indium arsenide, and gallium indium arsenide, respectively, a field effect transistor is provided in which the indium concentration can be significantly increased and the thickness of the layer can be increased thereby increasing the sheet charge density of the field effect transistor.

Spinel is a natural insulator having a resistivity greater than $10^8$ ohm centimeters. This is a desirable characteristic for devices such as field effect transistors and high electron transistors operating at microwave frequencies. Moreover, spinel is an extremely rugged and thermally stable material having a relatively high melting point. One particular example of spinel, magnesium aluminate $MgAl_2O_4$, has a melting point of about 2100° C. and is nearly as rugged as sapphire. Further still, $MgAl_2O_4$ has a crystal structure which is cubic and having a lattice constant of 8.08 Å for stoichiometric $MgAl_2O_4$ and a cubic sublattice having a lattice constant of $A_0/\sqrt{2}$. For $MgAl_2O_4$, the sublattice constant is 5.713 which is substantially matched to the lattice constant of aluminum gallium indium arsenide having a composition of $(Al_xGa_{1-x})_{0.85}In_{0.15}As$.

BRIEF DESCRIPTION OF THE DRAWINGS

The foregoing features of this invention, as well as the invention itself, may be more fully understood from the following detailed description of the drawings, in which:

FIGS. 1–5 are a series of cross-sectional views showing various embodiments of field effect transistors in accordance with the present invention.

DESCRIPTION OF THE PREFERRED EMBODIMENTS

Figure 4:
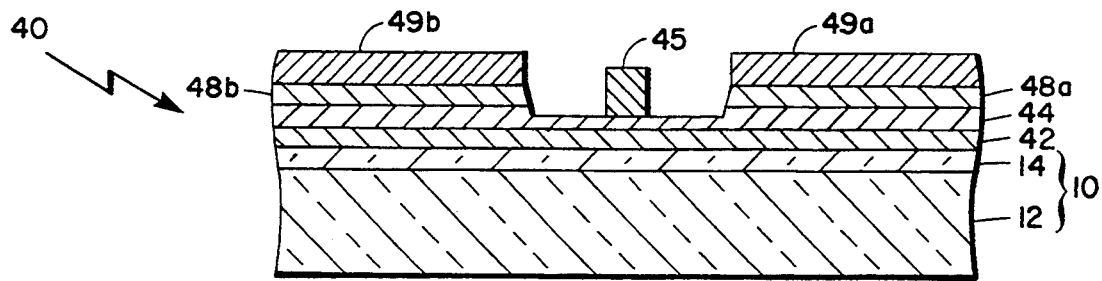

Referring now to FIG. 1, a composite substrate 10 is shown to include a substrate 12 here comprised of spinel having disposed thereover a buffer layer 14 comprised of a lattice matched Group III–V material. As used herein, spinel refers to a number of oxides of the general formula $AB_2O_4$. Examples of oxides having a spinel structure include magnesium aluminate ($MgAl_2O_4$), zinc ferric oxide ($ZnFe_2O_4$), cadmium ferric oxide ($CdFe_2O_4$), ferrous aluminate ($FeAl_2O_4$), cobalt aluminate ($CoAl_2O_4$), nickel aluminate ($NiAl_2O_4$), manganese aluminate ($MnAl_2O_4$), and zinc aluminate ($ZnAl_2O_4$). In particular, the above recited spinel structures are so-called "normal" spinel in which the $A^{2+}$ ions are disposed on tetrahedral sites of the spinel structure of the material and the $B^{3+}$ ions are on the octahedral sites. In the second type of spinel structure the so-called "inverse" spinels the $A^{2+}$ and half of the $B^{3+}$ ions are on the octahedral sites whereas the other half of the $B^{3+}$ ions are on the tetrahedral sites. Here a preferred material for substrate 12 is magnesium aluminate. The structures to be described below are based upon the use of magnesium aluminate. However, any one of the other aforementioned materials either normal spinel or inverse spinel which would have a different lattice constant could alternatively be used and is accommodated by changing the composition of the layers to be described. That is, the composition of the layers are changed to provide such layers with crystal structures having lattice constants which are appropriate for the particular device to be provided.

The spinel crystal structure is a cubic structure which is often viewed as a combination of rock salt and zinc blend cubic structures. The oxygen atoms in the spinel structure are in face centered cubic close packing arrangement. The spinel has a subcell structure in which there are four octahedral interstices and eight tetrahedral interstices.

Still referring to FIG. 1, disposed over substrate 12 is a buffer layer 14 comprised of a Group III–V material. Here the buffer layer 14 is preferably lattice matched to the crystal structure of the substrate 12. Thus, using magnesium aluminate ($MgAl_2O_4$) as an example for substrate 12, the buffer layer 14 is here a layer of (aluminum, gallium) indium arsenide having a composition $(Al_xGa_{1-x})_{0.85}In_{0.15}As$ which is grown over substrate 12 and is undoped to provide a layer having a relatively high resistivity.

The attractive feature of this substrate arrangement 10 is that the spinel structure (such as $MgAl_2O_4$) is cubic and for $MgAl_2O_4$ has a lattice constant ($A_0$) of 8.08 Å for stoichiometric $MgAl_2O_4$ spinel. In the (100) plane of the substrate, the magnesium atoms form a sublattice having a lattice constant given by $A_0/\sqrt{2}$ which for magnesium aluminate is 8.08 Å/$\sqrt{2}$ or 5.713 Å. A feature of the above-recited material combination is that the material $(Al_xGa_{1-x})_{0.85}In_{0.15}As$ has a lattice constant $A_0$ equal to 5.715 Å. Thus, there is a close match between the sublattice in the (100) plane of spinel and the lattice constant $A_0$ of (aluminum, gallium) indium arsenide having a 15% indium composition. For other examples of spinel, such as those mentioned above, a simple expedient, therefore, would be to choose a composition (y) of (aluminum, gallium)$_{1-y}$ indium$_y$ arsenide having a lattice constant $A_0$ which closely matches or matches the sublattice constant $A_0$ provided by the selected spinel material.

The substrate arrangement 10 as described above in conjunction with FIG. 1 is here used for various devices, as will now be described.

Referring now to FIG. 2, a lattice matched metal semiconductor field effect transistor 20 (MESFET) is shown to include the substrate arrangement 10 generally described in conjunction with FIG. 1 comprised of the substrate 12 of spinel (here $MgAl_2O_4$) and a buffer layer 14 (here comprised of $(Al_xGa_{1-x})_{0.85}In_{0.15}As$). Disposed over buffer layer 14 is a channel layer 22 comprised of gallium$_{1-Y}$ indium$_Y$ arsenide where $Y \leq 0.15$ having an N-type dopant concentration of here silicon or other suitable N-type dopants which is doped to a concentration in the range of typically $5 \times 10^{16}$ atoms/cc to $1 \times 10^{18}$ atoms/cc. Disposed over channel layer 22 are here a pair of isolated contact regions 28a, 28b, as shown, here also comprised of gallium indium arsenide having a concentration of indium to arsenic of 15% and here doped N+, that is, more heavily doped with silicon atoms or other suitable N-type dopants generally in the range of greater than $1 \times 10^{18}$ atoms/cc. Disposed over contact layers 28a and 28b are a pair of source and drain contacts 29a and 29b, as shown, and disposed in a recess provided through contact layers 28a, 28b and through a selective portion of channel layer 22 is a gate electrode 25 which is disposed in Schottky barrier contact to the channel layer 22. Typical materials and typical thicknesses for the Schottky barrier contact for the gate electrode 25 include titanium (1000 Å), platinum (1000 Å), a layer of gold (3000 Å). Similarly, drain and source electrodes are generally comprised of 50 Å of nickel, 900 Å of germanium-gold alloy, 300 Å of nickel, and 4000 Å of gold. Further, the source and drain electrodes are generally alloyed with the contact layers 28a, 28b by exposing said layers to a elevated temperature to provide low resistivity ohmic type contacts. The Schottky barrier gate electrode 25 is generally disposed on the surface after alloying of the source and drain contacts. Such steps are well familiar to one of ordinary skill in the art fabricating MESFETs comprised of gallium arsenide layers disposed over gallium arsenide substrates.

One advantage which is provided with the structure described in conjunction with FIG. 2 is that the channel layer 22 having, for example, a 15% concentration of indium with respect to arsenic ($Ga_{0.85}In_{0.15}As$) should provide a MESFET having improved frequency performance since the gallium indium arsenide channel layer will have better charge transport properties such as electron saturated velocity and electron mobility compared to a layer of gallium arsenide.

Still referring to FIG. 2, the MESFET 20, as described above, can be made pseudomorphic by increasing the concentration of indium beyond y=0.15. That is, as is commonly employed with high electron mobility transistors, the use of indium in a heterojunction structure has certain desirable properties. Namely, an increase in indium generally increases or improves the charge transport properties of the layer. Thus, by increasing the concentration of indium in the channel layer 22 of the device shown in FIG. 1, a pseudomorphic MESFET is provided. The exact increase in the indium concentration would be related to the channel thickness. For example, for a channel layer of 600 Å, a composition of $Ga_{0.80}In_{0.20}As$ (i.e. Y=0.2) should be possible.

Still referring to FIG. 2, a strain compensated pseudomorphic MESFET can be provided by providing buffer layer 14 with a composition ratio of In to As of Y<0.15. This would provide the buffer layer 14 with a strain characteristic which is opposite to that of a channel layer 22 having a higher composition of indium to arsenic (i.e. Y>0.2).

Referring now to FIG. 2A, a further embodiment of a pseudomorphic MESFET 20' is here shown to include the substrate arrangement 10, channel layer 22, and contact layer 28a, 28b, as generally described above in conjunction with FIG. 2, and further includes interposed between the buffer layer 14 and the channel layer 22 a strain compensation layer 21. For the above-described material system using a $(Ga_xAl_{1-x})_{0.85}In_{0.15}As$ buffer layer, a strain compensation layer of $(Ga_xAl_{1-x})_{1-y}In_yAs$, the same material as the buffer layer 14 but having a $Ga_{1-Y}In_YAs$ channel layer 22, the strain compensation layer 21 could be grown with a composition (y) of indium with y<0.15. This would provide a strain compensation layer 21 having strains which are opposite to the corresponding strains provided in the channel layer 22 and thus the channel layer 22 can be grown to an alternatively larger thickness or higher concentration of indium and thus channel layer 22 comprised of $Ga_{1-y}In_yAs$ where y>0.2 is provided.

An alternative arrangement would be to provide the strain compensating layer 21, as shown in FIG. 2A, with here 150 Å thick layer of $Ga_{0.75}Al_{0.25}As$ which again would provide strains which are opposite to the corresponding strains provided by channel layer 22.

Referring now to FIG. 3, an insulated gate field effect transistor (IGFET) is shown to include the substrate arrangement 10 as generally described in conjunction with FIG. 1, a channel layer 32, here comprised of gallium indium arsenide ($Ga_{x-y}In_yAs$) where the composition ratio y of indium to arsenic is 0.15 and an insulating layer 37 interposed between channel layer 32 and contact layers 38a, 38b, as shown. Here the insulating layer 37 is $(Ga_xAl_{1-x})_{0.85}In_{0.15}As$. Since gallium and aluminum have substantially the same lattice constants, the material will still be lattice matched to the preceding materials. Since aluminum indium arsenide has a higher bandgap than gallium indium arsenide the incorporation of aluminum into the layer 37 will increase the bandgap of layer 37, thus providing a semi-insulating type of structure. The gate electrode 35 may then be disposed in Schottky barrier contact with the insulating layer 37, as shown, and source and drain electrodes 39a, 39b are also disposed in ohmic contact over contact layers 38a, 38b, as shown. As also mentioned above, for the metal semiconductor field effect transistor, the channel layer 32 may be made pseudomorphic by increasing the indium concentration beyond x=0.15 to approximately x=0.2 and further beyond x=0.2 by incorporating strain compensation layers between the channel layer 32 and buffer layer 14 as was generally done in conjunction with FIG. 2A.

It should be further noted that with the insulated gate FET 30, described above, a conductive path for source and drain contact layers 38a, 38b is provided through the insulating layer 37 using one of several techniques. For example, one technique would be to simply have insulating layer 37 in the regions 37' disposed under contact layers 38a, 38b doped during the alloying of the contact layers with the insulating layer. That is, during the alloying process, portions of germanium gold would diffuse through insulator layer 37 to render the regions 37' thereunder conductive while leaving a remaining portion disposed in the channel region underlying the gate electrode 35 insulative. A second technique would be to selectively dope by implantation or other techniques portions of insulator layer 37 disposed under contact layers 38a, 38b and a further technique would be to etch away portions of insulator layer 37 disposed under contact layers 38a, 38b.

Referring now to FIG. 4, a high electron mobility lattice matched transistor structure 40 is shown to include the substrate arrangement 10, generally described in conjunction with FIG. 1, a channel layer 42, here comprised of gallium indium arsenide having a composition $Ga_{0.85}In_{0.15}As$ and having a thickness, generally in the range of 300 Å–500 Å, a charge donor here N-type layer 44 disposed over channel layer 42 comprised of a higher bandgap material, lattice matched to the channel layer 42 and here comprised of $(Ga_{1-x}Al_x)_{0.85}In_{0.15}As$ which is doped N-type by introduction of silicon or other suitable N-type dopants.

Alternatively, P-type dopants such as beryllium may be used for P-type high electron mobility transistors.

A gate electrode 45 is disposed in a recess and in Schottky barrier contact to layer 44. Disposed over charge donor layer 44 are contact layers 48a, 48b, here comprised of gallium indium arsenide which are heavily doped N-type. The typical dopant concentrations are generally as those described above in conjunction with the MESFET arrangement described in conjunction with FIG. 2. The gallium indium arsenide channel layer 42 having a thickness of 300–500 Å is feasible since the channel layer 42 is lattice matched to the underlying substrate arrangement 10. The presence of a relatively thick channel layer 42 compared to prior approaches increases the sheet density of carriers. Furthermore, by providing the charge donor layer 44 as a quaternary layer, the ratio (x) of $gallium_{1-x}$ to $aluminum_x$ in the layer may be adjusted to maximize the conduction band discontinuity between the charge donor layer and the channel layer and hence maximize channel carrier density without providing high trap or defect densities.

As with the MESFET in FIG. 2, the channel layer can be made pseudomorphic by increasing the indium concentration in the channel layer and thus provide a channel layer having a composition of $Ga_{0.70}In_{0.30}As$ with a thickness of 150 Å.

Moreover, the pseudomorphic HEMT 40, as shown in FIG. 4, can further be made with a pseudomorphically strained gallium aluminum arsenide charge donor layer and thus would have a typical composition of $Ga_{0.75}Al_{0.25}As$. Such a layer could have a thickness of 300 Å and be used with a channel layer of 150Å of $gallium_{1-y}indium_y$ arsenide having a concentration of indium (y) of y=0.3. In this structure, there would be a relatively large conduction band discontinuity at the gallium aluminum arsenide/gallium indium arsenide heterojunction which would lead to very high sheet densities and the strain provided in the gallium indium arsenide layer would be opposite to and thus compensate for the strain provided in the gallium aluminum arsenide layer.

Figure 5:
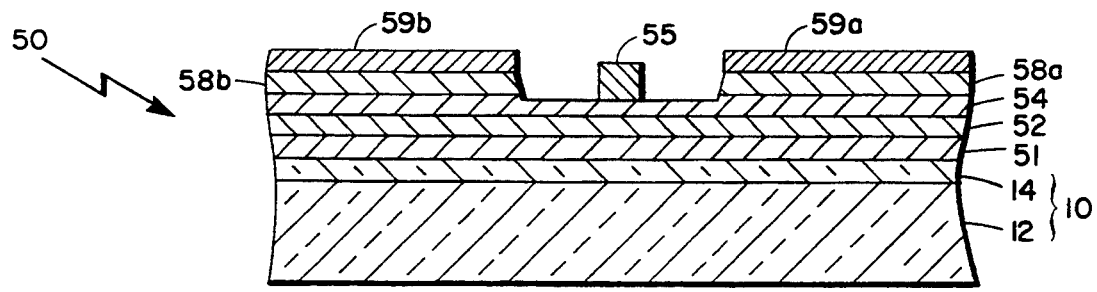

Referring now to FIG. 5, a double strain compensated pseudomorphic HEMT 50 is shown to include the substrate arrangement 10, generally described in conjunction with FIG. 1, a strain compensation layer 51, here comprised of a layer of gallium aluminum arsenide having a composition of $Ga_{0.75}Al_{0.25}As$, a channel layer 52 comprised of undoped gallium indium arsenide having a composition of $Ga_{0.85}In_{0.45}As$, and a charge donor layer 54 comprised of doped gallium aluminum arsenide having a thickness of 300 Å and a composition of $Ga_{0.75}Al_{0.25}As$. A gate electrode 55 is disposed in Schottky barrier contact with layer 54. N+ contact layers 58a, 58b comprised of gallium indium arsenide where X=0.15 are also disposed over the charge donor layer 54. The strain compensation layer 51 of gallium aluminum arsenide disposed under the gallium indium arsenide layer allows for a very high indium concentration or, alternatively, a relatively thick indium layer or any combination thereof to be used as the channel layer 52. The conduction band discontinuity provided at the gallium aluminum arsenide/gallium indium arsenide interface or junction is larger than the conventional lattice matched HEMT on indium phosphide, since the Schottky barrier is placed on the gallium aluminum arsenide layer having a bandgap of 1.8 eV compared to the bandgap height of 1.5 eV provided by aluminum indium arsenide ($Al_{0.48}In_{0.52}As$) latticed matched to InP substrates. The higher bandgap of the present structure should provide concomitant improvements in breakdown voltage levels compared to conventional HEMTs on indium phosphide (InP) substrates.

Figure 6:
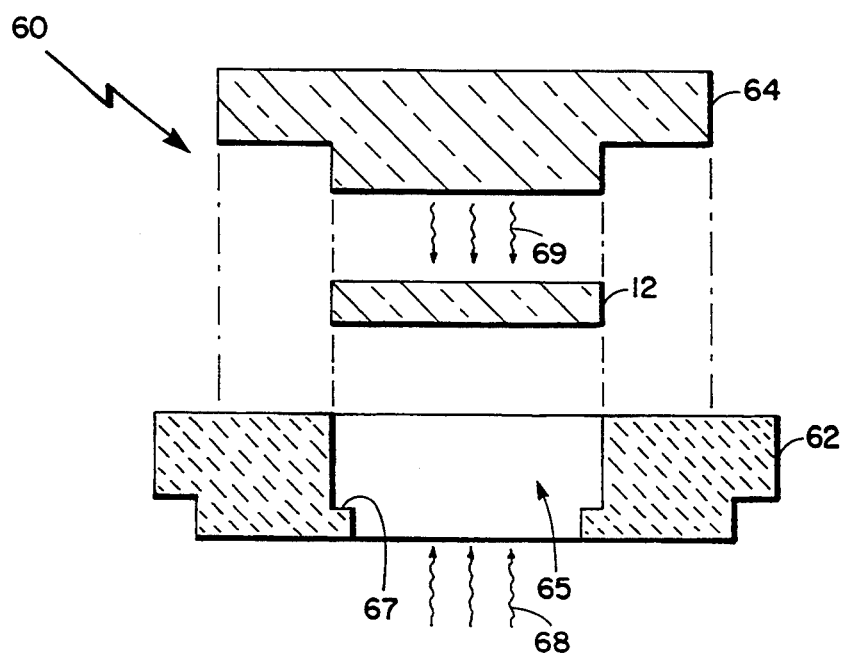
FIG. 6 is a cross-section view showing a preferred substrate holder arrangement for growing semiconductor layers on spinel.

Each of the structures described in conjunction with FIGS. 1–5 and 2A may be manufactured using conventional deposition techniques. A preferred technique which would be to sequentially grow each of the layers of the device using molecular beam epitaxial growth techniques. In particular when using molecular beam epitaxial growth techniques, a preferred substrate holder 60, as shown in FIG. 6, is here used. Spinel structures such as the above-mentioned magnesium aluminate have relatively high transmittances to short wavelength radiation. Typically in a molecular beam epitaxial reactor, a substrate is radiantly heated by use of a hot filament which has substantial energy at these short wavelengths. Accordingly, since the substrate is generally transparent for most of these wavelengths, adequate heating of the substrate is difficult. Thus, a special substrate holder is generally provided to hold the magnesium aluminate substrate 12, as shown in FIG. 6. Here the substrate holder is comprised of an energy absorbing/radiating material such as graphite which can convert the radiant energy 68 provided from a filament source of a molecular beam epitaxial reactor (not shown) into conduction energy which can be used to heat the substrate 12, as well as, convert the incident radiation 68 from the filament source to lower energy radiation 69 (i.e. longer wavelength radiation) which radiates from the substrate holder 60. Here substrate holder 60 includes a base 62, preferably comprised of graphite, having an aperture 65 to receive substrate 12 and to receive a substrate plug 64, also comprised of graphite. When assembled, the substrate holder 60 has the substrate 12 disposed within aperture 65 of base 62 resting upon a ledge portion 67 of aperture 65. The plug 64 is then disposed over and in contact with the back surface of substrate 12 thus providing a graphite enclosure which can absorb the incident radiation 68 and the substrate 12 via conduction from the surfaces of substrate holder 60, as well as, from radiation of longer wavelength radiation from the substrate holder 60. An illustrative example of typical temperatures and parameters used to provide each of the layers using molecular beam epitaxy technique would include sources of gallium disposed at a temperature of 960° C., arsenic disposed at 280° C., aluminum disposed at 1100° C., indium disposed at 820° C., and silicon disposed at 1000° C. A substrate, such as the magnesium aluminate substrate 12, would be disposed at a temperature of 600° C. These temperature characteristics would provide growth rates of approximately 1 micron per hour. To grow any of the layers mentioned above, selected ones of the gallium, arsenic, aluminum, indium, and silicon sources would be activated and provide corresponding molecular beams of said material toward the substrate. Obviously, to change the relative compositions of any one of the elements with respect to remaining ones of the elements, the temperatures mentioned above would be adjusted. The temperatures mentioned above merely typical ranges are not intended to encompass all possible variations on a molecular beam epitaxial process for growing such layers.

For using a metalorganic chemical vapor deposition technique, sources of trimethyl gallium would be held at 0° C., trimethyl indium at 20° C., trimethyl aluminum at 10° C., and arsenic would be introduced in the form of arsine ($ASH_3$). The substrate would be held at a temperature of typically 650° C. and sources of silicon such as contained silane or disilane would also be introduced into the reactive vessel to provide appropriately doped layers. Likewise, with the use of the molecular beam epitaxy technique, the parameters mentioned above are generally typical and not intended to encompass every possible variation on the process for growing each of the aforementioned layers. Furthermore, flow rates in the metal organic chemical vapor deposition technique would be adjusted in order to provide resulting materials having different compositions.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A semiconductor device comprising:
   a substrate comprised of a material having a spinel crystal structure, such substrate having a surface, such surface having a (100) crystallographic orientation in the plane of such surface; and
   a buffer layer disposed on said surface, such buffer layer being comprised of $(Ga_{1-x}Al_x)_{1-y}In_yAs$, said composition ratio Y being selected to provide a buffer layer having a lattice constant which is substantially matched to a lattice constant of the material of the substrate, and
   wherein said spinel material of the substrate has a crystal structure including a cubic sublattice crystal structure having a lattice constant to which the buffer layer is substantially matched thereto.

2. The device, as recited in claim 1, wherein said substrate is comprised of magnesium aluminate and said buffer layer is $(Ga_{1-x}Al_x)_{0.85}In_{0.15}As$.

3. A semiconductor device comprising:
   a substrate comprised of a material having a spinel crystal structure, such substrate having a surface disposed in the (100) crystallographic plane and a lattice constant $A_0$;
   a buffer layer disposed on said surface, such buffer layer being comprised of $(Ga_{1-x}Al_x)_{1-y}In_yAs$ where y is selected to provide buffer layer with a lattice constant which is substantially matched to a sublattice constant, $A_0/\sqrt{2}$, where $A_0$ is the lattice constant of the spinel material of the substrate; and
   a channel layer disposed over said buffer layer comprised of a layer of $Ga_{1-z}In_zAs$;
   means for providing a Schottky barrier contact over said channel layer; and
   means for providing ohmic collection from said channel layer.

4. The field effect transistor, as recited in claim 3, wherein said substrate is comprised of magnesium aluminate and said buffer layer is comprised of $(Ga_{1-x}Al_x)_{0.85}In_{0.15}As$.

5. The field effect transistor, as recited in claim 4, wherein said channel layer has a composition (Z) of $Ga_{1-z}In_zAs$ where $Z \leq 0.2$ and is doped N-type.

6. The transistor, as recited in claim 5, wherein said channel layer has a composition of $Ga_{1-z}In_zAs$ where $Z \leq 0.15$ and said Schottky barrier contact is disposed on said channel layer and said means for providing ohmic collection are disposed over said channel layer.

7. The transistor, as recited in claim 5, wherein said channel layer has a composition ratio (Z) of indium to arsenic of $0.15 < Z \leq 0.2$.

8. The transistor, as recited in claim 4, further comprising a charge donor layer disposed adjacent said channel layer, with said channel layer being undoped.

9. The transistor, as recited in claim 8, wherein said channel layer has a composition Z of indium to arsenic of $Z = 0.15$.

10. The transistor, as recited in claim 8, wherein said channel layer has a composition Z of indium to arsenic of $Z > 0.15$.

11. The transistor, as recited in claim 8, wherein the channel layer has a composition Z of indium to gallium of $Z > 0.2$ and wherein the transistor further comprises:
    a strain compensation layer disposed adjacent said channel layer having strain characteristics opposite to strain characteristics of said channel layer.

12. The transistor, as recited in claim 3, further comprising:
    an insulating layer disposed between the channel layer and the means for providing Schottky barrier contact over said channel layer.

13. The transistor, as recited in claim 12, wherein said insulating layer is aluminum indium arsenide.

14. The transistor, as recited in claim 4, further comprising:
    a strain compensation layer disposed between said buffer layer and said channel layer having a strain characteristic opposite to the strain characteristic of said channel layer and comprised of $(Ga_{1-x}Al_x)As$;

with said channel layer having a composition ratio (Z) of indium to arsenic of $Z>0.2$; and having a charge donor layer disposed over said channel layer with said charge donor layer comprised of gallium aluminum arsenide.

* * * * *